(12) United States Patent
Craninckx et al.

(10) Patent No.: US 11,764,799 B2
(45) Date of Patent: Sep. 19, 2023

(54) TIME-INTERLEAVED ANALOG-TO-DIGITAL CONVERTER AND CONVERSION METHOD THEREOF

(71) Applicant: IMEC VZW, Leuven (BE)

(72) Inventors: Jan Craninckx, Boutersem (BE); Ewout Martens, Heverlee (BE)

(73) Assignee: IMEC VZW, Leuven (BE)

(*) Notice: Subject to any disclaimer, the term of this patent is extended or adjusted under 35 U.S.C. 154(b) by 36 days.

(21) Appl. No.: 17/569,061

(22) Filed: Jan. 5, 2022

(65) Prior Publication Data
US 2022/0271765 A1 Aug. 25, 2022

(30) Foreign Application Priority Data

Feb. 22, 2021 (EP) ..................................... 21158316

(51) Int. Cl.
| | |
|---|---|
| *H03M 1/12* | (2006.01) |
| *H03M 1/10* | (2006.01) |
| *H03M 1/18* | (2006.01) |
| *H04N 25/75* | (2023.01) |
| *H03M 1/56* | (2006.01) |
| *H04N 5/06* | (2006.01) |

(52) U.S. Cl.
CPC ....... *H03M 1/1215* (2013.01); *H03M 1/1023* (2013.01); *H03M 1/187* (2013.01); *H03M 1/56* (2013.01); *H04N 5/06* (2013.01); *H04N 25/75* (2023.01); *H03M 1/123* (2013.01)

(58) Field of Classification Search
CPC .. H03M 1/1215; H03M 1/1023; H03M 1/187; H03M 1/123; H03M 1/56; H04N 5/06; H04N 25/75

USPC .................................................. 341/122, 169
See application file for complete search history.

(56) References Cited

U.S. PATENT DOCUMENTS

| | | | |
|---|---|---|---|
| 8,368,578 B2 | 2/2013 | Harpe | |
| 8,730,081 B2* | 5/2014 | Yang | H04N 25/709 348/241 |

(Continued)

OTHER PUBLICATIONS

Extended European Search Report and Written Opinion, Application No. EP21158316.6, dated Jul. 26, 2021, 9 pages.

(Continued)

*Primary Examiner* — Khai M Nguyen
(74) *Attorney, Agent, or Firm* — McDonnell Boehnen Hulbert & Berghoff LLP

(57) ABSTRACT

Example embodiments relate to time-interleaved analog-to-digital converters and conversion methods thereof. One embodiment includes a slope analog-to-digital converter. The slope analog-to-digital converter includes a sample and hold stage configured to sample an analog input signal at a sampling frequency. The slope analog-to-digital converter also includes a comparator downstream to the sample and hold stage configured to compare the analog input signal to a slope signal. Further, the slope analog-to-digital converter includes a digital logic configured to receive a counter value corresponding to a voltage level of the slope signal and to sample the counter value based upon the comparison, thereby generating a digital representation of the analog input signal based upon the comparison. The slope signal is asynchronous to the sampling frequency.

15 Claims, 7 Drawing Sheets

(56) References Cited

U.S. PATENT DOCUMENTS 9,716,510 B2 * 7/2017 Milkov ............... H03M 1/1245
2012/0050082 A1   3/2012 Danesh et al.

OTHER PUBLICATIONS

Danesh, Seyed, Jed Hurwitz, Keith Findlater, David Renshaw, and Robert Henderson. "A reconfigurable 1 GSps to 250 MSps, 7-bit to 9-bit highly time-interleaved counter ADC with low power comparator design." IEEE journal of solid-state circuits 48, No. 3 (2013): 733-748.

Snoeij, Martijn F., Albert JP Theuwissen, Johan H. Huijsing, and Kofi AA Makinwa. "Power and area efficient column-parallel ADC architectures for CMOS image sensors" in Sensors, 2007 IEEE, pp. 523-526 IEEE, 2007.

Harpe, Pieter JA, Cui Zhou, Kathleen Philips, and Harmke de Groot. "A 0.8-mW 5-bit 250-MS/s time-interieaved asynchronous digital slope ADC." IEEE journal of solid-state circuits 46, No. 11 (2011): 2450-2457.

* cited by examiner

US 11,764,799 B2

TIME-INTERLEAVED ANALOG-TO-DIGITAL CONVERTER AND CONVERSION METHOD THEREOF

CROSS-REFERENCE TO RELATED APPLICATIONS

The present application is a non-provisional patent application claiming priority to European Patent Application No. EP 21158316.6, filed Feb. 22, 2021, the contents of which are hereby incorporated by reference.

FIELD OF THE DISCLOSURE

The disclosure relates to time-interleaved analog-to-digital signal conversion, especially for high-speed wireline applications.

BACKGROUND

In some instances, wireline receivers are augmented with digital signal processors (DSPs), where after equalization, the input is converted into the digital domain by a high-speed analog-to-digital converter (ADC), typically operating at tens of Giga-samples per second (GSPS). A powerful DSP further processes this data to perform clock and data recovery, and as such extracts the precise received data of serial input signals. Generally, these ADCs are implemented as time-interleaved successive-approximation register ADC (SAR-ADC) because of its energy efficiency as well as its capability to be implemented in an advanced digital-centric technology node.

However, a disadvantage of the use of SAR-ADCs is their limited speed with respect to the typical area requirements. Since every individual SAR-ADC contains a capacitive digital-to-analog converter (DAC), it requires a certain area to implement it and is especially critical when implementing many SAR-ADCs in parallel. Moreover, the capacitive DAC requires clean reference voltage, further arises complexities for reference voltage distribution.

An alternative approach is present in the art to implement the ADCs with smaller area ADCs such as a slope ADC with a greater number. For example, the document US 2012/0050082 A1 presents a composite ADC comprising a plurality of single slope ADCs. A global ramp generator generates a plurality of analog ramp signals for each ADCs, where each ADC performs analog-to-digital conversion of a sampled analog input signal in a time interleaved manner. Although the composite ADC solves the area as well as speed related problems, the generation of the plurality of analog ramp signals leads to a complex ramp generation scheme since each analog ramp signal is required to be synchronized with the conversion period of each respective ADCs.

SUMMARY

Accordingly, the disclosure provides a slope ADC, a time-interleaved ADC, and a conversion method for the same, which can address the above-mentioned limitations.

The first independent claim provides a slope ADC. Additionally, the second independent claim provides a time-interleaved ADC. Further, the third independent claim provides a method. The dependent claims contain further features.

According to a first example embodiment, a slope ADC is provided. The slope ADC comprises a sample and hold stage configured to sample an analog input signal at a sampling frequency. The slope ADC further comprises a comparator downstream to the sample and hold stage configured to compare the analog input signal to a slope signal. The slope ADC moreover comprises a digital logic downstream to the comparator configured to receive a counter value corresponding to a voltage level of the slope signal and to sample the counter value based upon the comparison, thereby generating a digital representation of the analog input signal based upon the comparison. In this context, the slope signal is asynchronous to the sampling frequency. In some embodiments, the asynchronous nature of the slope signal with respect to the sampling frequency or sampling clock of the slope ADC facilitates convenient and simplified yet robust reference signal generation for analog-to-digital signal conversion.

In some embodiments, the slope signal is configured to be operable with a slope repetition period $T_{slope}$. In addition, the sample and hold stage is further configured to sample the analog input signal over a sampling period $T_{smp}$, and to hold a voltage level of the sampled analog input signal over a hold period $T_{hold}$. In this regard, the hold period $T_{hold}$ is greater than the slope repetition period $T_{slope}$. This may ensure that the slope ADC performs the comparison, i.e. signal conversion, at least once during a hold period or conversion period.

In some embodiments, the digital logic is further configured to sample the counter value based upon the comparison in a memory block. In this context, the digital logic is further configured to sample the counter value in the memory block on a rising edge or on a falling edge of the comparator output. Additionally or alternatively, the digital logic is further configured to sample the counter value in the memory block exclusively during the hold period Thom. Further additional to this or as an alternative, the digital logic is further configured to sample the counter value in the memory block at least once per hold period $T_{hold}$ (e.g., only once per hold period $T_{hold}$).

In some embodiments, the digital logic is further configured to add or subtract an offset value (e.g., a fixed offset value) to the counter value. Further, the offset value can be pre-determined as well as can be corrected or altered during the signal conversion operation. This may compensate for mismatches in the comparator, e.g. in comparator threshold voltage and/or in delay. Further, the digital counter value may be represented in a Gray code, and the digital logic may comprise a Gray-to-Binary converter. Therefore, time skew problems that may arise between the different bits when sampling or storing their respective values are circumvented.

In some embodiments, the slope analog-to-digital converter is a single-slope ADC. Alternatively, the slope analog-to-digital converter is a dual-slope ADC (e.g., a multi-slope ADC).

According to a second example embodiment, a time-interleaved ADC is provided. The time-interleaved ADC comprises an analog input signal, a slope generator configured to generate a slope signal having a slope repetition period $T_{slope}$, a global counter configured to generate a counter value corresponding to a voltage level of the slope signal, and a plurality of slope ADCs according to the first example embodiment.

In this context, the plurality of slope ADCs are configured to commonly receive the slope signal and the respective counter value. In addition, the plurality of slope ADCs are configured to receive the analog input signal successively in time. Furthermore, each of the plurality of slope ADCs is configured to generate a digital representation of the analog input signal successively in time using the commonly received slope signal and the respective counter value. Hence, the plurality of slope ADCs will all clock in the counter value, i.e. to generate the respective digital representation of the analog input signal, however at various instances in time, especially based on the comparator result.

In this regard, the common slope signal comprises a slope repetition period $T_{slope}$ and is asynchronous to the sampling frequency of the slope ADCs. The respective hold period $T_{hold}$ of the sample and hold stages of the plurality of slope ADCs is greater than the slope repetition period $T_{slope}$.

Therefore, example embodiments overcome the speed limitation of faster ADCs, such as a SAR-ADC, for a given area requirement by implementing smaller and relatively slower slope ADCs, however increasing the conversion speed significantly for a given area requirement by having a greater number of ADCs. Additionally, example embodiments minimize the complexities in generating the ramp or slope signal by generating a single analog slope signal instead of a plurality of slope signals. The single slope signal is globally fed to each of the plurality of slope ADCs whereby each ADC compares the respective time-interleaved sampled analog input signals.

In some embodiments, a slope signal generator comprises the slope generator and the global counter. The slope signal generator generates a slope voltage as the slope signal that monotonously increases or decreases during a time $T_{rise}$ with a repetition rate $T_{slope}$. The slope signal generator further generates a digital counter value corresponding to the slope voltage. In this regard, the digital counter value is globally fed to the plurality of slope ADCs in an analogous manner to the slope signal.

Since for each slope ADC, the hold period or conversion period Thou is greater than the slope repetition period $T_{slope}$, this may facilitate that each of the plurality of slope ADCs performs signal conversion at least once during their respective conversion period. This is highly beneficial since the plurality of slope ADCs are fed with a single global slope signal, where the slope repetition period is asynchronous to the hold period or conversion period.

In some embodiments, the time-interleaved ADC further comprises a data aligner configured to combine the corresponding digital representation of the analog input signal from each of the plurality of slope ADCs, thereby generating a digital representation of the analog input signal. As the plurality of slope ADCs will clock in the counter value at various instances in time based on the comparator result, they are configured to provide the counter value to the data aligner successively in time. Therefore, high-speed analog-to-digital signal conversion is facilitated, which may be used, for example, for DSP-based wireline receivers.

In some embodiments, the time-interleaved ADC further comprises a clock generator configured to generate a plurality of clock signals, each having an identical clock period however different phases relative to one another. This facilitates the time-interleaved sampling of the analog input signal by the respective sample and hold stages of the respective slope ADCs, operable at respective clock signals.

In some embodiments, each of the plurality of slope ADCs corresponds to a conversion channel whereby the plurality of slope ADCs are arranged in parallel to each other, thereby facilitating a plurality of conversion channels operable with a common slope signal.

Further, the plurality of conversion channels may be arranged in an array (e.g., in a two-dimensional array).

In some embodiments, the time-interleaved ADC further comprises a hierarchical sampling scheme configured to implement time-interleaving in at least two hierarchical levels. In addition, the hierarchical sampling scheme is further configured to implement time-interleaving in one of at least two hierarchical levels vertically over rows of the two-dimensional array and to implement time-interleaving in one of at least two hierarchical levels horizontally over columns of the two-dimensional array of the plurality of conversion channels. Therefore, a high interleaving factor can be achieved that increases the aggregate conversion speed of a number of time-interleaved channels.

According to a third example embodiment, a method for time-interleaved analog-to-digital conversion is provided. The method comprises the steps of providing an analog input signal, providing a plurality of slope ADCs according to the first example embodiment, providing the plurality of slope ADCs with a common slope signal and a respective counter value, receiving the analog input signal successively in time by the plurality of slope ADCs, and generating, by each of the plurality of slope ADCs, a digital representation of the analog input signal in time succession using the common slope signal and the respective counter value.

In this regard, the common slope signal comprises a slope repetition period $T_{slope}$ and is asynchronous to the sampling frequency of the slope ADCs. The respective hold period Thou of the sample and hold stages of the plurality of slope ADCs is greater than the slope repetition period $T_{slope}$.

In some embodiments, the method further comprises the step of combining the corresponding digital representation of the analog input signal from each of the plurality of slope ADCs, thereby generating a digital representation of the analog input signal.

BRIEF DESCRIPTION OF THE DRAWINGS

Example embodiments are now further explained with respect to the drawings by way of example only, and not for limitation.

DETAILED DESCRIPTION

Reference will now be made in detail to various embodiments, examples of which are illustrated in the accompanying drawings. However, the following embodiments may be variously modified and the range of the present invention is not limited by the following embodiments. Similar entities and reference numbers in different figures have been partially omitted.

Figure 1A:
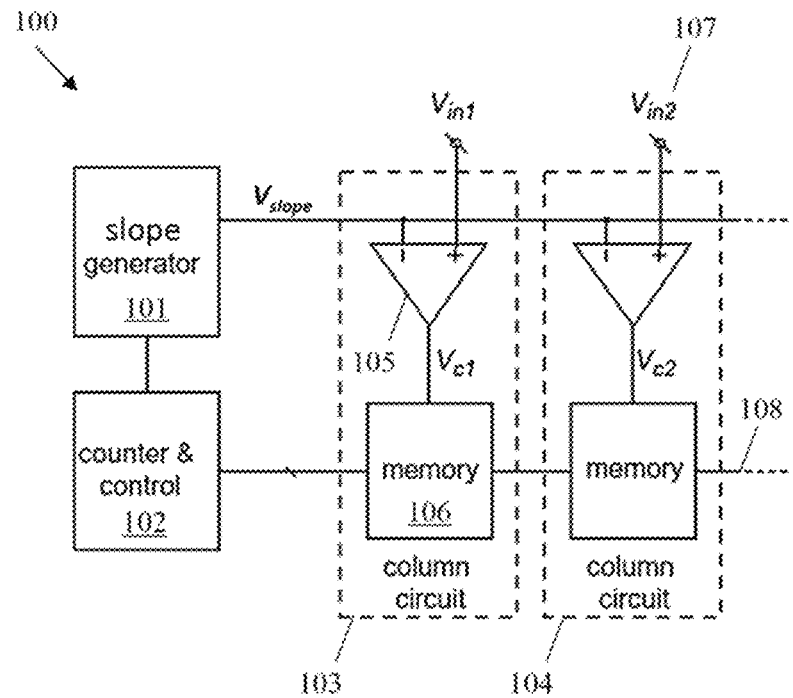
FIG. 1A shows a block diagram of a column-parallel single-slope ADC, according to example embodiments.
Figure 1B:
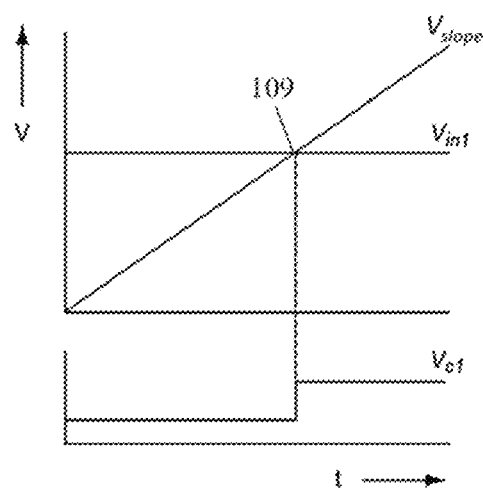
FIG. 1B shows a timing diagram of column-parallel single-slope ADC, according to example embodiments.

FIGS. 1A and 1B show an example column-parallel single-slope ADC 100 and its respective operation are illustrated. Particularly, FIG. 1A shows an example block diagram of the column-parallel single-slope ADC 100 and FIG. 1B shows the timing diagram of the column-parallel single-slope ADC.

Generally, to achieve high-speed signal conversion in, especially in DSP-based wireline receivers, all ADCs are implemented as time-interleaved SAR-ADCs. Typically, the SAR-ADC architecture demonstrates higher energy efficiency, as well as possesses the capability to be implemented in an advanced digital-centric technology node. Since its basic elements are a capacitive DAC, a comparator, and control logic, none of which requires high-performance analog transistor properties, and hence scaling into advanced nodes is relatively risk-free.

However, as described above, a disadvantage of the use of SAR-ADCs is their limited speed. Typical designs in advanced nodes reach conversion speeds up to ~1 GS/s, which includes the use of a number of parallel time-interleaved channels, where interleaving factors of e.g. 64× are common. Future wireline communication requirements may include even higher data rates, so higher ADC sampling speeds (>100 GS/s), and thus higher interleaving factors. Since the speed of a SAR-ADC does not scale further with technology nodes, this brings along some challenges.

Since every individual SAR-ADC contains a capacitive DAC, it may incorporate a certain area to implement it. Because of the limited resolution that may be incorporated, this size is not substantial for one ADC, e.g. a lane height of 10 or 20 μm, but when adding many of those in parallel, the total ADC size becomes substantial. Apart from the economic cost of this area, it becomes problematic to distribute the high-frequency input signal over such long distances to the individual lane ADCs. The same goes for the digital outputs, since they all have to be routed over long distances to a central combined reconstructed output for further processing.

Another problem is the reference voltage distribution. The capacitive DACs in each lane needs a rather clean reference voltage in order to provide a clean residue signal for the SAR-ADC operation. These DACs also present a dynamic load to the reference buffer, which should have a low enough output impedance to keep the reference voltage steady. Therefore, on one hand making a reference buffer with low enough output impedance, and on the other hand distributing that over long distance to the ADCs is not very convenient.

Instead of trying to speed up the individual channels, the approach presented here proposes to use many more, but significantly smaller ADCs, such that the total area will be smaller. The smallest ADC is a slope ADC, often used in massively column-parallel image sensors as shown in FIG. 1A.

The slope signal $V_{slope}$ is generated by a slope generator 101 where the respective digital counter values are generated via a counter and control logic 102. Each column circuit 103, 104 operates as a slope ADC and is fed with the respective slope signal $V_{slope}$ and the respective counter values. Each column circuit 103, 104 comprises a comparator 105 that compares an analog signal 107 with the slope signal $V_{slope}$. The comparison operation is illustrated in FIG. 1B, where each comparator 105 "toggles", as shown at point 109, when the slope signal $V_{slope}$ exceeds the analog signal 107. Upon a successful comparison, i.e. after a comparator 105 toggles, the respective digital counter value is stored in a local memory 106, where the cumulative digital outputs are re-sampled through a common bus line 108 to generate the complete digital representation of the analog signal 107.

Therefore, many parallel input voltages can be sampled simultaneously, and then compared to a common slope signal. This architecture can be heavily parallelized for a number of inputs. Each individual column 103, 104 contains only a comparator 105 and a memory 106, and all analog complexity and accuracy is shifted to the common slope generator 101. It can be implemented with high performance, as its associated power and/or area may be shared with many ADCs.

However, the big difference between an image sensor system and a time-interleaved ADC is that now all input signals to the ADC lanes are not synchronous anymore, but are shifted in time.

Figure 2:
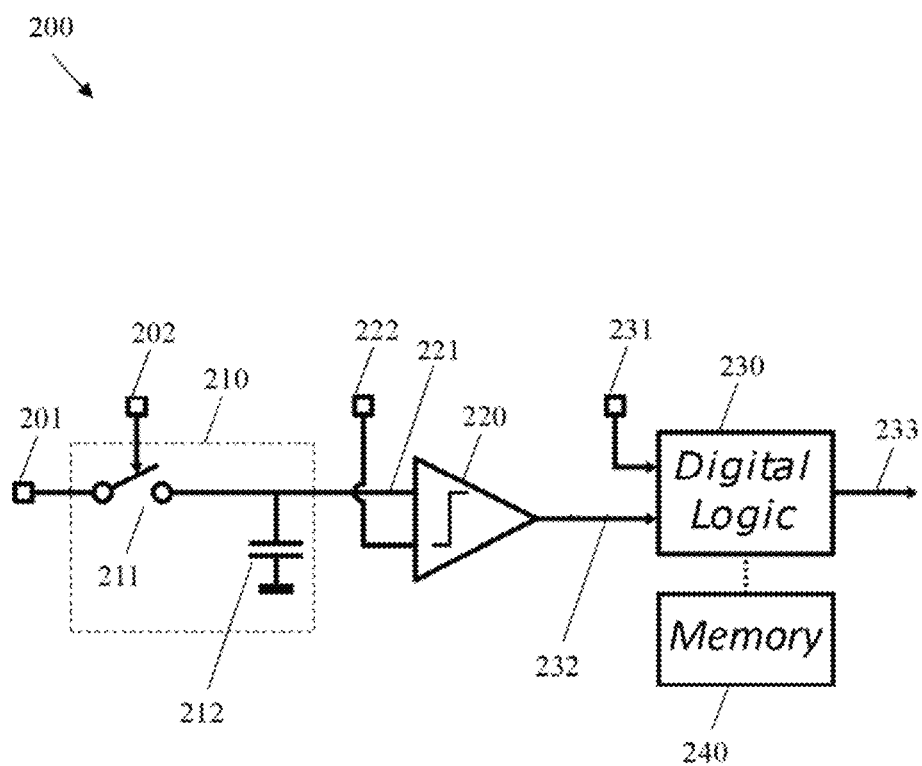
FIG. 2 shows a slope ADC, according to example embodiments.

In FIG. 2, a slope ADC 200 according to the first example embodiment is illustrated. The slope ADC 200 comprises an input node 201 configured to input an analog input signal to be converted, followed by a sample and hold stage 210. The sample and hold stage 210 may be implemented as a switched-capacitor circuit comprising a switch 211 and a series capacitor 212. The sample and hold stage 210 further comprises a clock input node 202 configured to input a respective clock signal so as to operate at a defined sampling frequency in order to sample and to hold the analog input signal. In this regard, the sample and hold stage 210, driven by the clock frequency of the clock signal, samples the analog input signal over a sampling period $T_{smp}$ to generate a sampled analog signal, where the voltage level is stored or held in the capacitor 212 over a hold period or conversion period $T_{hold}$.

The slope ADC 200 further comprises a comparator 220 downstream to the sample and hold stage 210 and further a digital logic 230 downstream to the comparator 220. The comparator 220 comprises a first input 221 operably coupled to the output of the sample and hold stage 210, especially to the series capacitor 212, and is configured to input the sampled analog signal. The comparator 220 further comprises a second input 222 configured to receive a slope signal or an analog slope voltage. It is particularly to be noted that the slope signal is asynchronous to the ADC sampling frequency, i.e. the slope frequency runs asynchronously to the ADC clock with $T_{slope} < T_{hold}$.

The comparator 220 continuously compares the sampled analog signal to the slope signal, especially to the specific voltage level of the slope signal at a comparison instance, especially during the hold or conversion period. Upon a successful comparison, i.e. the case when the voltage level of the slope signal exceeds the voltage level of the sampled analog signal, the comparator 220 toggles its output.

On the other hand, the digital logic 230 comprises a first input 231 configured to input a counter value corresponding to the voltage level of the slope signal, especially corresponding to the monotonously increasing or decreasing slope voltage. The digital logic 230 further comprises a second input 232 operably coupled to the output of the comparator 220 and is configured to input the comparator output.

Moreover, the digital logic 230 comprises a local memory 240 and is further configured to store digital bits onto the local memory 240. The local memory 240 may be integrated with the digital logic 230. As a result, upon a successful comparison, the digital logic 230 receives the counter value on the rising edge or on the falling edge of the comparator output, indicative of the digital representation of the sampled analog signal for the specific comparison instance. The digital representation or value is then stored locally on the local memory 240. The digital logic 230 further comprises an output node 233 operably coupled to the local memory 240, through which the digital representation or value of the sampled analog input signal can be extracted and routed from the local memory 240.

Figure 3:
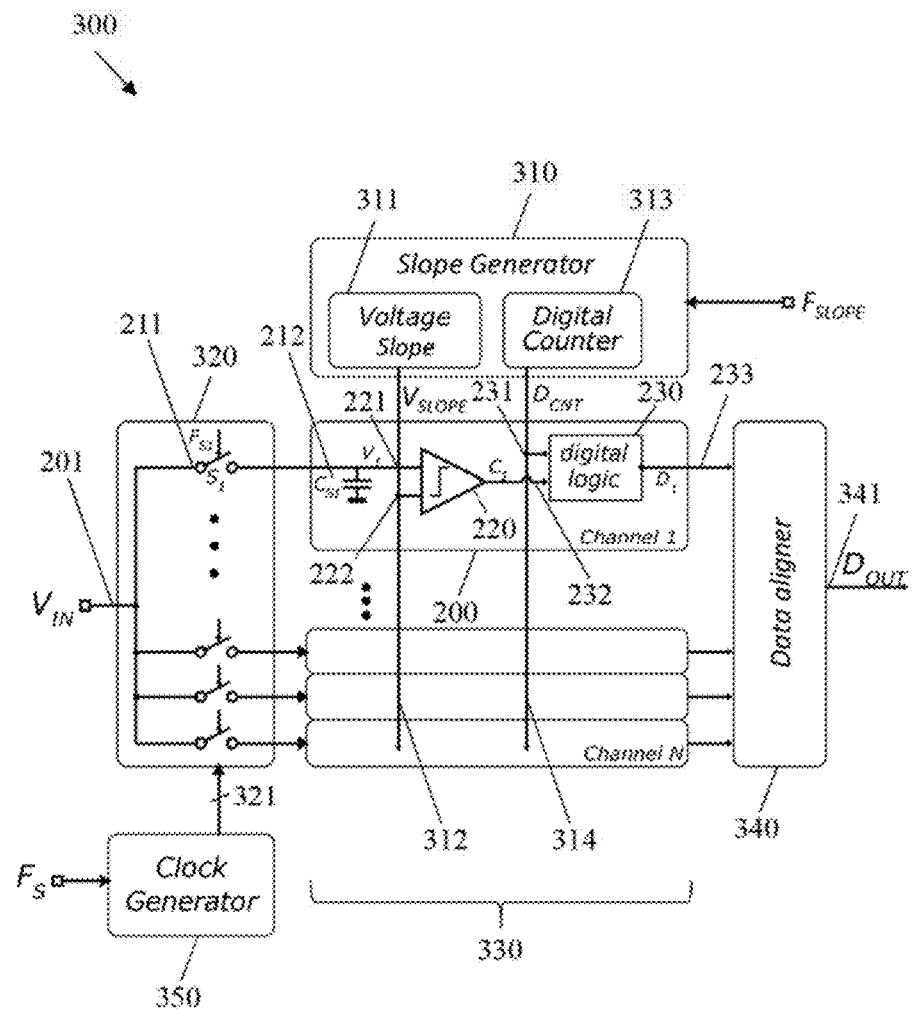
FIG. 3 shows a time-interleaved ADC, according to example embodiments.

In FIG. 3, a time-interleaved ADC 300 according to the second example embodiment is illustrated. The time-interleaved ADC 300 comprises a slope signal generator or so-called global slope generator 310 comprising an analog slope signal generator 311 and a digital counter 313. The slope generator 310, especially the analog slope signal generator 311, generates one single analog slope signal $V_{SLOPE}$ that is globally fed through a common path 312, e.g. a bus line. The digital counter 313 or so-called global counter generates a digital counter value $D_{CNT}$ corresponding to a voltage level of the analog slope signal $V_{SLOPE}$ and is globally fed through a common path 314, e.g. a bus line. The slope signal $V_{SLOPE}$ monotonously increases or decreases during a time $T_{rise}$ with a definite slope repetition period $T_{SLOPE}$, which can be predefined and is limited by an external slope frequency $F_{SLOPE}$.

The time-interleaved ADC 300 further comprises a plurality of slope ADCs 200 of FIG. 2, especially arranged in parallel in order to achieve a plurality of parallel conversion channels 330. In this regard, each sample and hold stages 210 of the slope ADCs 200 are arranged in a time-interleaved sampling arrangement 320.

Furthermore, the time-interleaved ADC 300 comprises an input node common to the input nodes 201 of each of the plurality of slope ADCs 200 for receiving an analog input signal $V_{IN}$. The respective clock input node 202 of the respective sample and hold stages 210 of the slope ADCs 200 are operably coupled to one of the set of outputs 321 of a clock generator 350. In this regard, each sample and hold stage 210, driven by the clock frequency of the clock signal, samples the analog input signal $V_{IN}$ in time succession over a sampling period $T_{smp}$ to generate a sampled analog signal $V_i$ (i=1, 2, 3, . . . , N), where the voltage level is stored or held in the capacitor 212 over a hold period or conversion period $T_{hold}$.

For each slope ADC 200, the first input 221 of the comparator 220 is operably coupled to the respective sample and hold stage 210, especially to the series capacitor 212, and is configured to input the sampled analog signal $V_1$. The second input 222 of the comparator 220 is operably coupled to the bus line 312 of the slope generator 311, through which the slope signal $V_{SLOPE}$ is globally fed.

The comparator 220 compares the sampled analog signal $V_1$ to the slope signal $V_{SLOPE}$, especially to the specific voltage level of the slope signal $V_{SLOPE}$ at a comparison instance, especially during the hold period or conversion period of the respective sample and hold stages 210. Upon a successful comparison, i.e. the case when the voltage level of the slope signal $V_{SLOPE}$ crosses the voltage level of the sampled analog signal $V_1$, the comparator 220 toggles its output $C_1$.

Accordingly, for each slope ADC 200, the first input 231 of the digital logic 230 is operably coupled to the bus line 214 of the global counter 211, through which the digital counter value $D_{CNT}$ of the corresponding slope signal $V_{SLOPE}$ is globally fed. The second input 232 of the digital logic 230 is operably coupled to the output of the comparator 220 and is configured to input the comparator output $C_1$.

Although it is not explicitly shown, it should be understood that the digital logic 230 includes the memory block 240 for storing digital bits. Upon a successful comparison, the digital logic 230 receives the digital counter value $D_{CNT}$, e.g. on the rising edge or on the falling edge of $C_1$ based on whether the slope signal monotonously increases or decreases, thereby generating the digital representation of the sampled analog signal $V_1$ for the specific comparison instance. The digital representation or value $D_1$ is then stored locally on the local memory 240, through which the digital representation or value $D_1$ of the sampled analog signal $V_1$ can be extracted and routed via the output node 233 of the digital logic 230.

The time-interleaved ADC 300 further comprises a data aligner 340 operably coupled to the respective digital logic 230 of the plurality of slope ADCs 200, especially to the output node 233 of the respective digital logic 230 of the plurality of slope ADCs 200. The data aligner 340 combines the corresponding digital representation $D_1$ of the sampled analog signal $V_1$ from the respective local memory 240 of the respective digital logic 230 of the plurality of slope ADCs 200. This results in the complete digital representation DOUT of the analog input signal $V_{IN}$, where the digital representation Dom is outputted from the data aligner 240, e.g. at an output node 341.

The time-interleaved ADC 300 moreover comprises a clock generator 350 configured to generate a plurality of clock signals, each having an identical clock period, however different phases relative to one another. The clock generator 350 is operably coupled to the time-interleaved sampling arrangement 320 so as to feed the respective clock signals to the plurality of sample and hold stages 210. In some embodiments, the clock generator 350 firstly receives a global clock signal driven by a clock frequency $F_s$. Alternatively, the clock generator 350 may generate the global clock signal internally.

In either case, the clock generator 350 factorizes the global clock signal by an interleaving factor limited by the number of the plurality of slope ADCs 200, shifts the plurality of clock signals by one clock period with respect to each other thereby generating the plurality of clock signals that are out of phase by at least one clock period. Hence, each of the slope ADCs 200 operates on a frequency lower than the global conversion rate $F_s$, which is defined by the interleaving factor. Although not shown in FIG. 3, the data aligner 340 receives the clock signal information from the clock generator 350 so that the data aligner 340 can re-sample the outputs of the respective slope ADCs 200, i.e. the digital value stored in the local memory 240 of the digital logic 230, to synchronize with the ADC clock.

In some embodiments, the data aligner 340 is configured to align the corresponding digital representation of the sampled analog signal from each of the plurality of slope ADCs 200 with the rising edge of the respective clock signal of the respective sample and hold stages 210. Therefore, at the end of the conversion period, the sampled or stored values are re-sampled so that the respective output is synchronous to the ADC clock.

In some embodiments, each of the slope ADCs 200 corresponds to a conversion channel for the time-interleaved ADC 300, e.g. channels 1 to N as shown in FIG. 3 for N number of ADCs i.e. an interleaving factor of N. In particular, each conversion channel comprises a respective sample and hold stage 210, a respective comparator 220 and a respective digital logic 230 of the plurality of slope ADCs 200. As depicted in FIG. 3, the conversion channels 1-N are arranged in parallel and are time-interleaved with respect to the analog input signal $V_{IN}$.

Therefore, each conversion channel commonly receives the analog input signal $V_{IN}$, operates in a time-interleaved manner, samples the analog input signal $V_{IN}$ in succession of time with respect to each other, and therefore generates the respective sampled analog signals. Furthermore, each conversion channel commonly receives the slope signal $V_{SLOPE}$, i.e. one single slope signal, and the corresponding digital counter value, and performs signal conversion in parallel to generate the digital representation Dour of the analog input signal $V_{IN}$.

Figure 4:
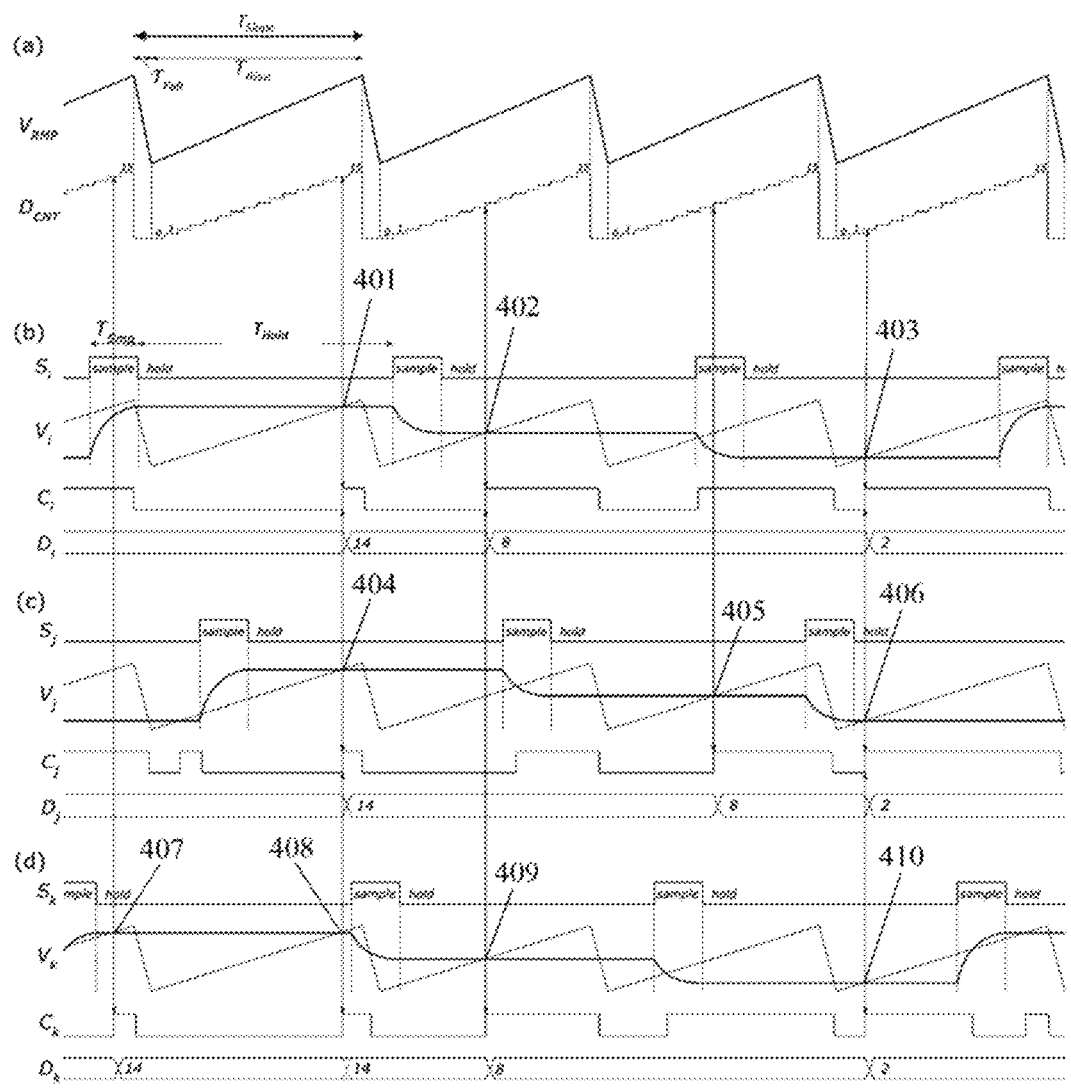
FIG. 4 shows a timing diagram of the time-interleaved ADC of FIG. 3, according to example embodiments.

In FIG. 4, a timing diagram of the time-interleaved ADC 300 of FIG. 3 is illustrated. In particular, the first section (a) of FIG. 4 shows the analog slope voltage signal or slope signal $V_{SLOPE}$ and the respective digital counter value $D_{CNT}$. The next sections (b), (c), and (d) of FIG. 4 shows three example time-interleaved channels, namely channel i, channel j and channel k, respectively. All example channels illustrated herein are implemented with a 4-bit single-slope ADC. For each channel, the sampling signal S, followed by the analog input signal V, followed by the comparator output C, followed by the output of the digital logic D, i.e. the respective digital value of the analog input signal V, are illustrated. Moreover, the analog input signal V may be such that the signal includes a high-level portion, a mid-level portion, and a low-level portion in terms of voltage levels. However, the analog input signal V is shifted in time with respect to each channels i,j,k because of the time-interleaved operation.

Along the first section (a) of FIG. 4, the slope signal $V_{SLOPE}$, which is globally distributed to all the channels i,j,k and is depicted as a saw-tooth signal having a rise time $T_{rise}$ and a fall time Thu. Therefore, the slope repetition period is defined by:

$$T_{slope} = T_{rise} + T_{fall},$$

where the slope repetition period is limited by the external slope frequency $F_{SLOPE}$, as mentioned above. Analogous to this slope signal $V_{SLOPE}$, a digital counter value DINT is globally distributed to all the channels i,j,k. The value of this counter is a representation of the respective voltage level of the slope signal $V_{SLOPE}$, which is defined from 0 to 15, i.e. 15 levels, in consecutive counts for a 4-bit ADC.

In general, for N number of interleaved channels, each interleaved channel operates on a frequency N times lower than the global conversion rate $F_s$. The conversion time per channel thus equals N times $F_s$, and is segmented in a sampling time or period $T_{smp}$ and a hold time or period $T_{hold}$. The sampling time is defined as time to sample the input signal in an input capacitor, e.g. the series capacitor 212, and the hold time $T_{hold}$ is defined as the time during which the sampled input voltage is held on that capacitor 212, and is compared to the global slope signal by the comparator, e.g. the comparator 220, in the channel.

For the proper operation, it may be that the slope repetition period $T_{slope}$ is smaller than the hold time $T_{hold}$. The slope frequency is thus higher than the channel conversion frequency, and hence the slope timing runs asynchronously from the ADC clock $F_s$. Due to the generation of a single global slope signal for all the ADCs instead of a plurality of slope signal dedicated to each respective ADCs, the timing of all N ADC channels cannot be made such that they all perfectly align with a complete rising or falling slope of the global slope signal, which is a prerequisite of a classical column-parallel slope ADC. However, with the proposed asynchronous but faster global slope signal, each channel will come across all possible voltages of the rising or falling slope at least once during its conversion time, although not in one consecutive monotonous rising or falling slope, but in segmented pieces, e.g. in two segmented pieces. Along FIG. 4, the slope signal $V_{SLOPE}$ is illustrated as a monotonous rising slope signal.

The digital logic 230 in each ADC channel i,j,k samples the value of the global counter $D_{CNT}$ in the local memory 240 exclusively during the hold time $T_{hold}$ and on the rising edge of the comparator output C since the slope signal is repetitively increasing. This relates to the instance when the rising slope of the slope signal $V_{SLOPE}$ crosses the sampled analog input signal V. Due to $T_{hold} > T_{slope}$, it may be that this will occur at least once per conversion cycle. In some situations, especially if $T_{hold}$ is much larger than $T_{slope}$, this can occur twice per conversion cycle, however it will always be the same counter value D that is sampled. At the end of the conversion cycle, the stored values are re-sampled such that the output is synchronous to the ADC clock $F_s$.

In some embodiments, the digital counter value $D_{CNT}$ is represented by a Gray code, in order to avoid time skew problems between the different bits when sampling its value in the local memory 240 of a channel. In this regard, a Gray-to-binary converter is incorporated into the digital logic 230 of the channel to convert the output to standard binary values for further processing. In addition to this, the digital logic 230 may add or subtract a fixed offset code to the value of the global counter $D_{CNT}$ to compensate for mismatches, e.g. in threshold voltage and in delay, in the comparator 220.

Turning back to FIG. 4, the second section (b) illustrates the timing operation of the conversion channel i. The first conversion 401 of channel i resembles the classical slope ADC timing, with a full monotonous slope signal present during the hold time or conversion period $T_{hold}$. Because the input signal V is high, the comparator changes sign towards the end of the conversion period $T_{hold}$ and the digital value 14 is stored. At the second conversion 402 the input signal V is at a mid-level and at the third conversion 403 the input signal V is at a low-level. The comparator changes sign accordingly at the respective comparison 402, 403 and the digital values 8 and 2 are stored, respectively, during their respective conversion period.

The third section (c) of FIG. 4 illustrates the timing operation of the conversion channel j. During the first conversion 404, the comparator outputs a rising edge much earlier in the conversion period, but at the same time as the one in channel i, and the same correct digital value 14 is stored. During the second conversion 405, although channel j stores the same correct digital value 8, channel j does this based on the slope signal of the next slope with respect to channel i, i.e. a time $T_{slope}$ later, however still within the conversion window of channel j. During the third conversion 406, the comparator again outputs a rising edge much earlier in the conversion period but at the same time as the one in channel i, and the same correct digital value 2 is stored.

The fourth section (d) of FIG. 4 illustrates the timing operation of the conversion channel k. Especially, the first comparison 407, 408 of channel k shows the case where the comparator could return two rising edges, one at 407 and one at 408, during the same conversion window. The digital logic will then sample twice the value of $D_{CNT}$. Since this happens at two instances in time where the slope signal is on the same level, it is twice the same value (14 in this case) that is clocked in. Therefore, the same correct digital value 14 is stored. During the second conversion 409, the comparator outputs a rising edge in the conversion period at the same time as the one in channel i, and the same correct digital value 8 is stored. During the third comparison 410, the comparator outputs a rising edge in the conversion period at the same time as the one in channel i as well as in channel j, and the same correct digital value 2 is stored.

The above-mentioned examples show the correct operation of the proposed time-interleaved ADC 300 with a slope frequency asynchronous and faster than the ADC interleaved clock. Although the above-mentioned examples are illustrated with respect to a particular time-interleaved ADC implementation having 4-bit single-slope ADCs for each conversion channels, it should be noted that the underlying technique is compatible for ADCs operating with higher slopes, e.g. dual-slope ADCs or multi-slope ADCs. Therefore, it may be possible to implement a time-interleaved ADC comprising a plurality of multi-slope ADCs, while maintaining adequate conversion accuracy with a high interleaving factor, especially when operating on a global slope signal with a slope frequency asynchronous and faster than the ADC interleaved clock.

Figure 5:
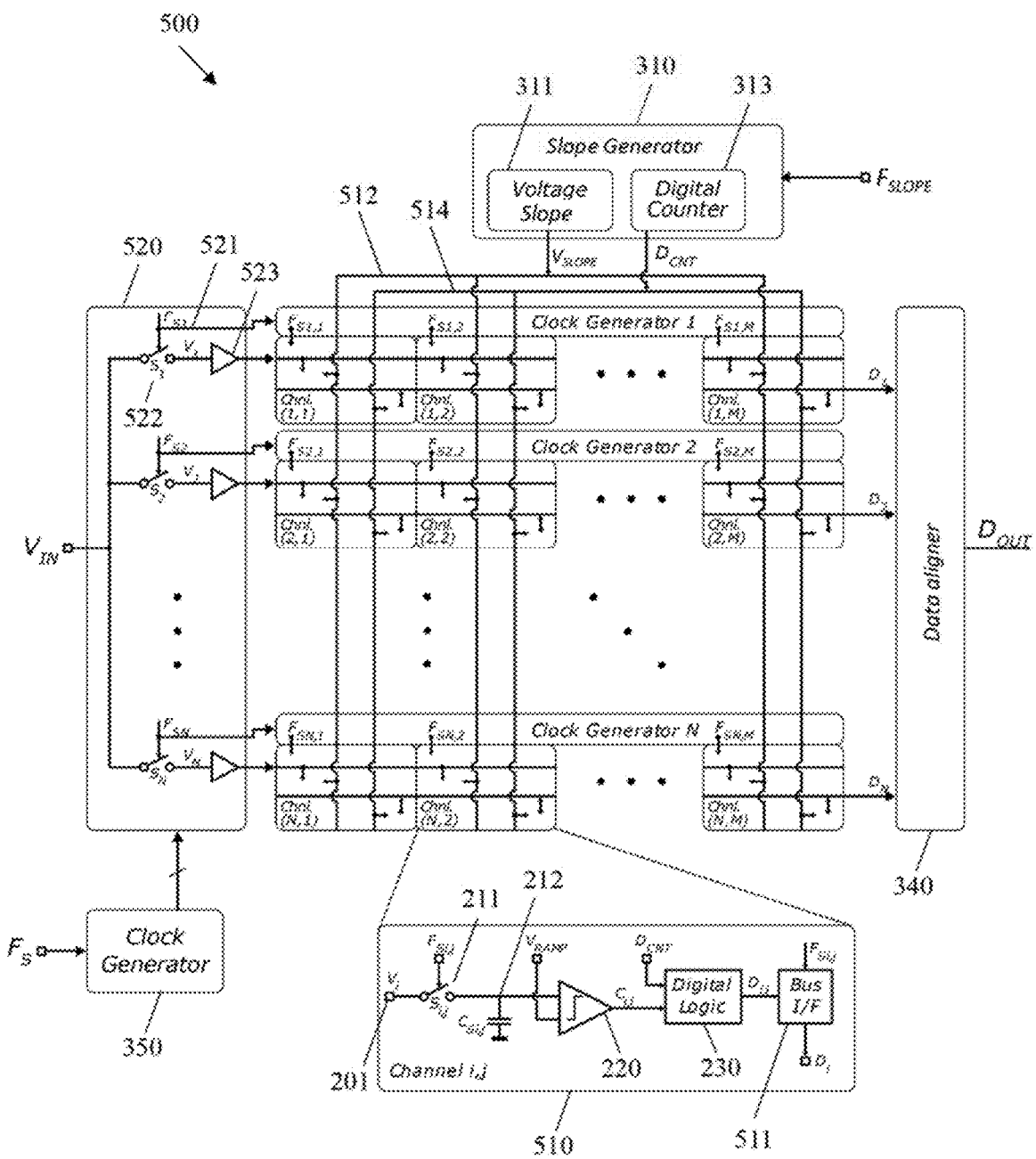
FIG. 5 shows a time-interleaved ADC, according to example embodiments.

In FIG. 5, a time-interleaved ADC 500 according to the first example embodiment is illustrated. Herein, the conversion channels 1 to N, as illustrated in FIG. 3, are arranged in a two-dimensional array N×M, where the respective conversion channels are denoted as Channel$_{i,j}$ (i=1, 2, 3, ..., N; j=1, 2, 3, ..., M). A representation of such a conversion channel 510 is depicted at the bottom of FIG. 5.

Because of the extremely small size of a slope ADC, the size of individual channels is also extremely small. Therefore, many of them can be interleaved in a manageable total area. In addition, because the speed of a slope ADC is much lower than the typically used SAR-ADCs, it may also incorporate a high interleaving factor to achieve sufficient aggregate conversion speed. Hence, a substantial amount of time-interleaved channels are implemented in a two-dimensional array as shown in FIG. 5. Herein, time-interleaving is implemented in at least two hierarchical levels (e.g., more than two hierarchical levels).

In particular, the time-interleaved ADC 500 comprises a hierarchical sampling scheme 520 that implements time-interleaving in at least two hierarchical levels. In this regard, the hierarchical sampling scheme 520 implements time-interleaving in one of at least two hierarchical levels vertically over rows of the two-dimensional array, i.e. a first interleaving rank, and to implement time-interleaving in one of at least two hierarchical levels horizontally over columns of the two-dimensional array, i.e. a second interleaving rank.

The first interleaving rank 520 is depicted vertically in the figure and splits the input signal $V_{IN}$ in N channels, each sampled by one of the N interleaved sampling clocks $F_{Si}$, where i=1, 2, 3, ..., N, at a frequency $f_s/N$, spaced one sample Ts apart. The resulting signals $V_i$, where i=1, 2, 3, ..., N, are distributed horizontally to the second interleaving rank 211, shown in the block 510 of the example conversion channels, that is split into M channels, each sampled by one of the N×M interleaved sampling clocks $F_{Si,j}$, where i=1, 2, 3, ..., N; j=1, 2, 3, ..., M, at a frequency $f_s/(N\times M)$. In this regard, the resulting signals V; are distributed directly through a distribution path 521 as well as optionally buffered through a buffered path 523.

The slope signal $V_{SLOPE}$ and its synchronous digital counter value $D_{CNT}$ are distributed to all channels of the N×M array through their respective routing paths 512 and 514. The functionality of each conversion channel 510 is the same as described along FIG. 2 for the slope ADC and along FIG. 3 for the time-interleaved ADC 300. The input signal $V_{IN}$ is sampled by a sample and hold stage, particularly sampled by a switch 211, denoted herein as $S_{i,j}$, where i=1, 2, 3, ..., N; j=1, 2, 3, ..., M, and sampled on a capacitor 212, denoted herein as $C_{i,j}$, where i=1, 2, 3, ..., N; j=1, 2, 3, ..., M. The sampled analog voltage is compared to the global slope signal or voltage by a comparator 220, and on a rising edge or on a falling edge of this comparator output, a digital logic 230 samples the value of the global counter DINT in a local memory.

In order to limit the amount of digital outputs routed horizontally towards the data aligner 340, a common bus 511 is implemented. In this regard, each of the outputs $D_{i,j}$, where i=1, 2, 3, ..., N; j=1, 2, 3, ..., M, is sequentially placed on a data bus Di, controlled e.g. by its sampling clock to prevent data conflicts on the bus.

This two-dimensional arrangement is a convenient way to time-interleave a substantial number of N×M slope ADC channels in a limited area, while keeping sufficient routing of the input signal and clock limited, such that the associated parasitic will not grow out of bound, which would limit the aggregate conversion speed that can be obtained.

Figure 6:
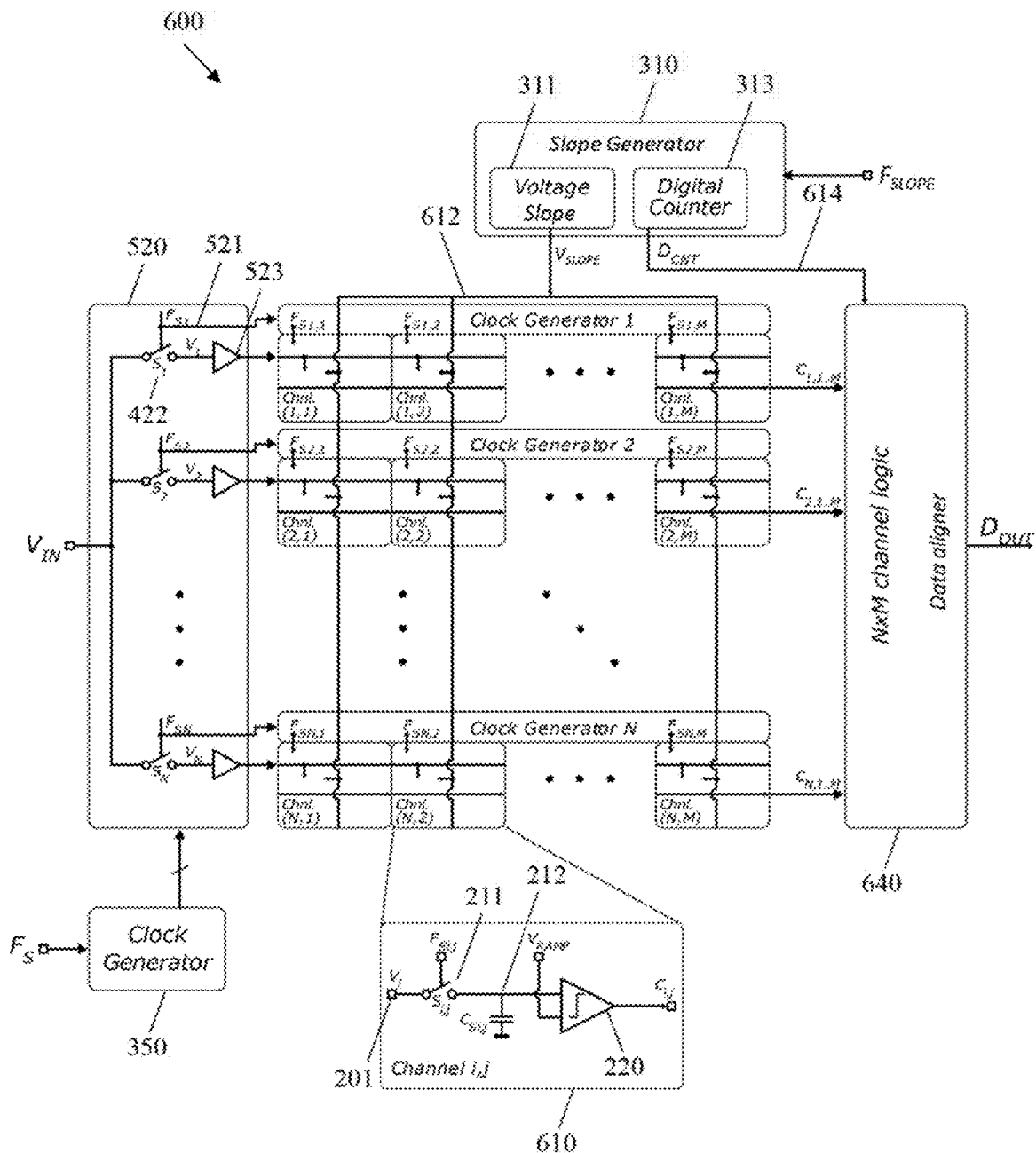
FIG. 6 shows a time-interleaved ADC, according to example embodiments.

In FIG. 6, a time-interleaved ADC 600 according to the second example embodiment is illustrated. The time-interleaved ADC 600 differs from the time-interleaved ADC 500 of FIG. 5 in that the digital logic 230 of each respective conversion channel 610 is brought out of the channel matrix and is placed in a larger digital block 640 along with the data aligner. However, the functionality of the digital logic 230 and the data aligner remain the same.

This may result in a smaller area per channel and effectively help keeping digital noise away from the analog sensitive blocks. Instead of a digital bus with the output words of every channel running from left to right, now each of the M comparator outputs $C_{N,M}$ are routed to the digital block 640. The slope signal $V_{SLOPE}$ is commonly distributed to the conversion channels 610 throughout the conversion matrix via a routing path 612. The digital counter value $D_{CNT}$ is now routed to the digital block 640 via a routing path 614, however commonly distributed to each respective digital logic 230 of the respective conversion channel 610.

The time-interleaved ADC 500 and the time-interleaved ADC 600 both depict the case where one single global slope is distributed to all ADC channels. In order to limit e.g. supply bounce caused by the increased area of the conversion matrix, which may have a signature with a frequency $F_{SLOPE}$, it is also conceivable to use a limited number of similar but time-shifted slopes and their respective counter values, and assign each ADC channel to one of these. This may spread out the supply bounce more evenly in time, which will limit its impact. However, the functionality of the time-interleaved slope ADCs will not be affected by the implementation.

Figure 7:
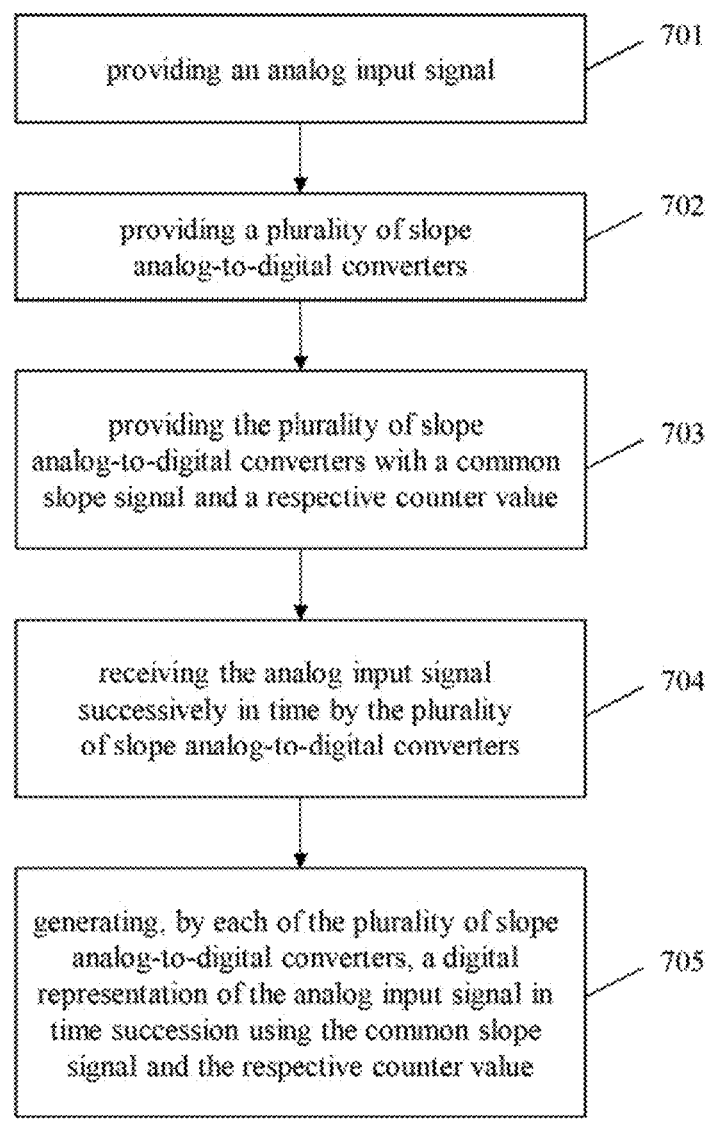
FIG. 7 shows a method, according to example embodiments.

In FIG. 7, a method according to the third example embodiment is illustrated. In a first step 701, an analog input signal is provided. In a second step 702, a plurality of slope analog-to-digital converters according to the first example embodiment is provided. In a third step 703, the plurality of slope analog-to-digital converters are provided with a common slope signal and a respective counter value. In a fourth step 704, the analog input signal is received in time succession by the plurality of slope analog-to-digital converters. Finally, in a fifth step 705, a digital representation of the analog input signal is generated by each of the plurality of slope analog-to-digital converters in time succession using the common slope signal and the respective counter value.

Embodiments herein can be implemented by hardware, software, or any combination thereof. Various embodiments may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Although embodiments been illustrated and described with respect to one or more implementations, equivalent alterations and modifications will occur to others skilled in the art upon the reading and understanding of this specification and the annexed drawings. For example, instead of a single-slope ADC, a dual-slope ADC or a multi-slope ADC can be implemented at each conversion channel. Further, although single-ended implementations are shown for one or more embodiments, persons skilled in the art can understand modifications to differential implementations. In addition, while a particular feature may have been disclosed with respect to only one of several implementations, such feature may be combined with one or more other features of the other implementations as may be desired for any given or particular application.

What is claimed is:

1. A slope analog-to-digital converter comprising:
    a sample and hold stage configured to sample an analog input signal at a sampling frequency;
    a comparator downstream to the sample and hold stage configured to compare the analog input signal to a slope signal; and
    a digital logic configured to:
       receive a counter value corresponding to a voltage level of the slope signal; and
       sample the counter value based upon the comparison, thereby generating a digital representation of the analog input signal based upon the comparison,
    wherein the slope signal is asynchronous to the sampling frequency.

2. The slope analog-to-digital converter according to claim 1,
    wherein the slope signal is configured to be operable with a slope repetition period $T_{slope}$,
    wherein the sample and hold stage is further configured to:
       sample the analog input signal over a sampling period $T_{smp}$; and
       hold a voltage level of the sampled analog input signal over a hold period $T_{hold}$, and
    wherein the hold period $T_{hold}$ is greater than the slope repetition period $T_{slope}$.

3. The slope analog-to-digital converter according to claim 2,
    wherein the digital logic is further configured to sample the counter value based upon the comparison in a memory block.

4. The slope analog-to-digital converter according to claim 3,
    wherein the digital logic is further configured to sample the counter value in the memory block on a rising edge or on a falling edge of the comparator output, or
    wherein the digital logic is further configured to sample the counter value in the memory block exclusively during the hold period $T_{hold}$, or
    wherein the digital logic is further configured to sample the counter value in the memory block at least once per hold period $T_{hold}$.

5. The slope analog-to-digital converter according to claim 3,
    wherein the digital logic is further configured to add or subtract an offset value, preferably a fixed offset value, to the counter value.

6. The slope analog-to-digital converter according to claim 1,
    wherein the slope analog-to-digital converter is a single-slope analog-to-digital converter, a dual-slope analog-to-digital converter, or a multi-slope analog-to-digital converter.

7. A time-interleaved analog-to-digital converter comprising:
    an analog input signal;
    a slope generator configured to generate a slope signal having a slope repetition period $T_{slope}$;
    a global counter configured to generate a counter value corresponding to a voltage level of the slope signal; and
    a plurality of slope analog-to-digital converters according to claim 1,
    wherein the plurality of slope analog-to-digital converters are configured to commonly receive the slope signal and the respective counter value,
    wherein the plurality of slope analog-to-digital converters are configured to receive the analog input signal successively in time, and
    wherein each of the plurality of slope analog-to-digital converters is configured to generate a digital representation of the analog input signal successively in time using the commonly received slope signal and the respective counter value.

8. The time-interleaved analog-to-digital converter according to claim 7,
    wherein the time-interleaved analog-to-digital converter further comprises a data aligner configured to combine the corresponding digital representation of the analog input signal from each of the plurality of slope analog-to-digital converters, thereby generating a digital representation of the analog input signal.

9. The time-interleaved analog-to-digital converter according to claim 7,
    wherein the time-interleaved analog-to-digital converter further comprises a clock generator configured to generate a plurality of clock signals, each having an identical clock period however different phases relative to one another.

10. The time-interleaved analog-to-digital converter according to claim 7,
    wherein each of the plurality of slope analog-to-digital converters corresponds to a conversion channel whereby the plurality of slope analog-to-digital converters are arranged in parallel to each other, thereby facilitating a plurality of conversion channels operable with a common slope signal.

11. The time-interleaved analog-to-digital converter according to claim 10,
    wherein the plurality of conversion channels are arranged in an array or a two-dimensional array.

12. The time-interleaved analog-to-digital converter according to claim 11,
    wherein the time-interleaved analog-to-digital converter further comprises a hierarchical sampling scheme configured to implement time-interleaving in at least two hierarchical levels.

13. The time-interleaved analog-to-digital converter according to claim 12,
    wherein the hierarchical sampling scheme is further configured to implement time-interleaving in one of at least two hierarchical levels vertically over rows of the two-dimensional array and to implement time-interleaving in one of at least two hierarchical levels horizontally over columns of the two-dimensional array.

14. A method for time-interleaved analog-to-digital conversion comprising:

providing an analog input signal;

providing a plurality of slope analog-to-digital converters according to claim 1;

providing the plurality of slope analog-to-digital converters with a common slope signal and a respective counter value;

receiving the analog input signal successively in time by the plurality of slope analog-to-digital converters; and generating, by each of the plurality of slope analog-to-digital converters, a digital representation of the analog input signal in time succession using the common slope signal and the respective counter value.

15. The method according to claim 14, wherein the method further comprises combining the corresponding digital representation of the analog input signal from each of the plurality of slope analog-to-digital converters, thereby generating a digital representation of the analog input signal.

\* \* \* \* \*